US011193960B2

(12) United States Patent
    Martel (10) Patent No.: US 11,193,960 B2
(45) Date of Patent: Dec. 7, 2021

(54) CURRENT SENSOR AND METHOD (71) Applicant: Siemens Aktiengesellschaft, Munich (DE)

(72) Inventor: Jean-Mary Martel, Tegernheim (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 0 days.

(21) Appl. No.: 16/903,444

(22) Filed: Jun. 17, 2020

(65) Prior Publication Data
    US 2020/0408810 A1    Dec. 31, 2020

(30) Foreign Application Priority Data

Jun. 27, 2019 (DE) .................. 102019209374.4

(51) Int. Cl.
    *G01R 19/00*    (2006.01)
    *G01R 19/165*   (2006.01)

(52) U.S. Cl.
    CPC .... *G01R 19/0023* (2013.01); *G01R 19/16566* (2013.01)

(58) Field of Classification Search
    None
    See application file for complete search history.

(56) References Cited

U.S. PATENT DOCUMENTS 5,202,621 A * 4/1993 Reischer .............. H01F 38/38
                                                323/358
2011/0291488 A1  12/2011 Deokar et al.
2012/0249151 A1 * 10/2012 Dobusch ............. H01H 83/144
                                                324/424
2015/0070124 A1 * 3/2015 Kapoor ............... H01F 41/0246
                                                336/211
2018/0128859 A1   5/2018 Shamir et al.
2020/0408810 A1 * 12/2020 Martel ............... G01R 19/0023

FOREIGN PATENT DOCUMENTS

DE    102012206225 A1    10/2013

OTHER PUBLICATIONS

German Office Action dated Jun. 18, 2020.

* cited by examiner

*Primary Examiner* — Lincoln D Donovan
*Assistant Examiner* — Khareem E Almo
(74) *Attorney, Agent, or Firm* — Harness, Dickey & Pierce, P.L.C.

(57) ABSTRACT

A current sensor is for determining the level of the current of a conductor of a low-voltage circuit. In an embodiment, it includes a current transformer including a magnetic core. The magnetic core is an annular core having a core inner diameter, a middle diameter and a core outer diameter. The annular core is wound with a secondary winding, including an inner opening with an inner diameter and an outer circumference with an outer diameter. The secondary winding supplies the circuit with electrical energy. The wound annular core is configured such that the difference between the middle diameter as the minuend and the inner diameter as the subtrahend is 0.5 to 0.6 times smaller than the difference between the outer diameter as the minuend and the inner diameter as the subtrahend, to achieve an optimum for supplying energy and determining the level of the current in connection with the circuit.

20 Claims, 3 Drawing Sheets

CURRENT SENSOR AND METHOD

PRIORITY STATEMENT

The present application hereby claims priority under 35 U.S.C. § 119 to German patent application number DE 102019209374.4 filed Jun. 27, 2019, the entire contents of which are hereby incorporated herein by reference.

FIELD

Embodiments of the invention generally relates to a current sensor and to a method for determining the level of the electrical current of a conductor of a low-voltage circuit.

BACKGROUND

Low voltage is used to mean voltages of up to 1000 volts AC or up to 1500 volts DC. Low voltage is used to mean, in particular, voltages which are greater than the extra-low voltage, with values of 50 volts AC or 120 volts DC.

A low-voltage circuit or network or installation is used to mean circuits having rated currents of up to 6300 amperes, more specifically up to 1200 amperes, 630 amperes, 125 amperes or 63 amperes.

Such low-voltage circuits are protected by different monitoring and protective devices such as miniature circuit breakers, circuit breakers in the form of molded case circuit breakers or air circuit breakers, residual current breakers, arc fault detection devices, power and current monitoring devices etc.

The level of the electrical current must generally be determined for all of these devices.

There is an increasing demand for current sensors which are intended to determine the level of the electrical current at particular points in the low-voltage circuit or network.

It is very difficult to implement an (intelligent) current sensor which is able to accurately measure a current and to transmit the data without an external power supply if possible.

The most important technical requirements imposed on such a sensor are:
  high nominal current: the sensor is intended to carry out accurate measurements up to the nominal current and under overload conditions;
  low starting current: the sensor is intended to already operate and carry out measurements at a very low current (in the range of 1% of the nominal current or a few amperes);
  the measurement is intended to be accurate, for example to comply with accuracy class 1;
  a solution for a power supply is intended to be integrated;
  it is intended to be small and cheap.

Known current sensors generally have the following disadvantages:
  use of an internal energy store, such as a battery, for supplying energy, with the disadvantage of a limited service life and operating temperature;
  energy production with a primary current flow using a converted current and using a separate transformer to measure the current. These have the disadvantage that they become expensive and large;
  energy production via sunlight or another light source: not suitable for indoor applications;
  energy production from electromagnetic RF sources: severe limitation of size and distance to the source.

SUMMARY

At least one embodiment of the present invention specifies a current sensor for determining the level of the current of a conductor of a low-voltage circuit, which current sensor is compact and has a small design, in particular with a core which is suitable both for supplying its own energy and for determining the level of the electrical current. A method for dimensioning such a core should also be specified.

Embodiments are directed to an arrangement or a method.

At least one embodiment of the invention provides a current sensor for determining the level of the current of a conductor of a low-voltage circuit, comprising:
  a current transformer which has a magnetic core and is used both to measure the level of the current of the conductor and to supply energy to the current sensor, wherein the magnetic core is an annular core having a core inner diameter di, a middle diameter dFE and a core outer diameter da,
  the annular core is wound with a secondary winding, as a result of which the core wound with the secondary winding has an inner opening with an inner diameter di_min and an outer circumference with an outer diameter da_max,
  the conductor which forms the primary winding of the current transformer is guided through the inner opening,
  the secondary winding is connected to a circuit, wherein the secondary winding supplies the circuit with electrical energy, and the circuit determines the level of the current of the conductor from the supplied electrical energy, digitizes it and wirelessly provides it.

At least one embodiment of the invention also specifies a parallel method for dimensioning the current transformer for a current sensor for determining the level of the current of a conductor of a low-voltage circuit, comprising:
  a current transformer which has a magnetic core and is used both to measure the level of the current of the conductor and to supply energy to the current sensor,
  wherein the magnetic core is an annular core having a core inner diameter di, a middle diameter dFE and a core outer diameter da,
  wherein the annular core is wound with a secondary winding, as a result of which the core wound with the secondary winding has an inner opening with an inner diameter di_min and an outer circumference with an outer diameter da_max,
  wherein the conductor which forms the primary winding of the current transformer is guided through the inner opening,
  wherein the secondary winding is connected to a circuit, wherein the secondary winding supplies the circuit with electrical energy, and the circuit determines the level of the current of the conductor from the supplied electrical energy, digitizes it and wirelessly provides it.

At least one embodiment of the invention also specifies a current sensor for determining the level of the current of a conductor of a low-voltage circuit, comprising:
  a current transformer, including a magnetic core, to measure the level of the current of the conductor and to supply energy to the current sensor, the magnetic core being an annular core including a core inner diameter, a middle diameter and a core outer diameter,
  wherein the annular core is wound with a secondary winding to form a wound inner core, including an inner opening with an inner diameter and an outer circumference with an outer diameter,
  wherein the conductor, forming a primary winding of the current transformer, is guided through the inner opening, wherein a secondary winding of the current transformer, connected to a circuit, to supply the circuit with electrical energy, the circuit being configured to determine the level of the current of the conductor from the electrical energy supplied, to digitize the current, and to wirelessly provide the current, the wound annular core being configured such that a difference between a middle diameter as a minuend and the inner diameter as the subtrahend is 0.5 to 0.6 times smaller than a difference between the outer diameter as the minuend and the inner diameter as the subtrahend, to achieve an optimum for supplying energy and determining the level of the current in connection with the circuit.

At least one embodiment of the invention also specifies a method for dimensioning a current transformer for a current sensor for determining the level of the current of a conductor of a low-voltage circuit, the method comprising:

dimensioning the current transformer to include a magnetic core, configured to measure the level of the current of the conductor and to supply energy to the current sensor, the magnetic core being an annular core including a core inner diameter, a middle diameter and a core outer diameter and the annular core being wound with a secondary winding, the core wound with the secondary winding including an inner opening with an inner diameter and an outer circumference with an outer diameter, the conductor forming the primary winding of the current transformer being guided through the inner opening and the secondary winding being connected to a circuit to supply the circuit with electrical energy, the circuit being configured to determine the level of the current of the conductor from the supplied electrical energy, digitize the current and wirelessly provide the current, wherein the wound annular core is dimensioned such that a difference between the middle diameter as a minuend and the inner diameter as a subtrahend is 0.5 to 0.6 times smaller than a difference between the outer diameter as the minuend and the inner diameter as the subtrahend to achieve an optimum for supplying energy and determining the level of the current in connection with the circuit.

BRIEF DESCRIPTION OF THE DRAWINGS

The described properties, features and advantages of this invention and the manner in which they are achieved become clearer and more distinctly comprehensible in connection with the following description of the example embodiments which are explained in more detail in connection with the drawing, in which.

DETAILED DESCRIPTION OF EXAMPLE EMBODIMENTS

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

At least one embodiment of the invention provides a current sensor for determining the level of the current of a conductor of a low-voltage circuit, comprising:

a current transformer which has a magnetic core and is used both to measure the level of the current of the conductor and to supply energy to the current sensor, wherein the magnetic core is an annular core having a core inner diameter di, a middle diameter dFE and a core outer diameter da, the annular core is wound with a secondary winding, as a result of which the core wound with the secondary winding has an inner opening with an inner diameter di_min and an outer circumference with an outer diameter da_max, the conductor which forms the primary winding of the current transformer is guided through the inner opening, the secondary winding is connected to a circuit, wherein the secondary winding supplies the circuit with electrical energy, and the circuit determines the level of the current of the conductor from the supplied electrical energy, digitizes it and wirelessly provides it.
\

According to at least one embodiment of the invention, the wound annular core is configured, in particular wound, in such a manner that the difference between the middle diameter dFE as the minuend and the inner diameter di_min as the subtrahend is 0.5 to 0.6 times (in particular 0.55 times) smaller than the difference between the outer diameter da_max as the minuend and the inner diameter di_min as the subtrahend in order to achieve an optimum for supplying energy and determining the level of the current in connection with the circuit.

Expressed in formulas:

$(dFE-di\_min)=0.5 \ldots 0.6 \times (da\_max-di\_min)$ $(dFE-di\_min)=0.55 \times (da\_max-di\_min)$ The use of a current transformer (or transformer) which is used both to produce energy and to measure the current makes it possible to achieve a very compact and small design of a current sensor with a simple structure. The use of a core with the determined proportions according to at least one embodiment of the invention makes it possible to achieve the best possible performance of a current sensor when producing energy in a tight space and with regard to temperature and heat dissipation.

A deviation from the range according to at least one embodiment of the invention results in a poorer performance of the current sensor; the starting current is higher or the maximum permissible nominal current is lower. The range according to the invention is an optimum with respect to supplying energy and determining the level of the current, in particular in connection with a circuit which is alternately switched back and forth between energy supply and measurement, especially if corresponding limit values are exceeded or undershot or reached.

Advantageous configurations of the invention are stated in the claims.

In one advantageous configuration of at least one embodiment of the invention, the annular core has a sheath, in particular made of insulating material such as epoxy resin, epoxy or polyamide. This has the particular advantage that the core is insulated with respect to the secondary winding. In particular, a higher degree of protection can be achieved in this manner and further safety can be achieved, in particular in the event of a fault.

In one advantageous configuration of at least one embodiment of the invention, the annular core with a sheath has a sheath outer diameter da2 and a sheath inner diameter di2, with the result that the sheathed core has a core area Acc formed by the difference of the squares of the sheath outer diameter da2 and the sheath inner diameter di2 multiplied by Pi/4

$Acc=Pi/4(da2^2-di2^2)$, the core wound with the secondary winding has a current transformer area Act formed by the difference of the squares of the outer diameter da_max and the inner diameter di_min multiplied by Pi/4

$Act=Pi/4(da\_max^2-di\_min^2)$, the core area Acc is 0.65 to 0.9 times the current transformer area Act $Acc=0.65 \ldots 0.9 \times Act$.

This has the particular advantage of achieving a further optimum for supplying energy and determining the level of the current in connection with the circuit.

In one advantageous configuration of at least one embodiment of the invention, the annular core is an annular strip-wound core.

This has the particular advantage that there is a simple and cost-effective implementation for the core and the strips are insulated from one another via oxide layers, thus reducing eddy currents and resulting losses.

In one advantageous configuration of at least one embodiment of the invention, the annular core has a rectangular cross section.

This has the particular advantage that it is possible to easily mount the core and to make better use of the available volume.

In one advantageous configuration of at least one embodiment of the invention, the annular core has a relative permeability between 10,000 and 100,000, in particular between 30,000 and 50,000, more specifically a value of approximately 40,000.

This has the particular advantage that a "high" permeability makes it possible to transform as much power as possible for the starting current, in particular a relative permeability of greater than 10,000. A "lower" permeability reduces the measurement error in the case of load currents with higher DC voltage components, in particular a relative permeability of less than 100,000.

In one advantageous configuration of at least one embodiment of the invention, the annular core is made of a ferromagnetic material, in particular nanocrystalline material, in particular from materials having iron or/and nickel.

Nanocrystalline material is used to mean materials having a crystalline structure or/and a particle size or crystal size in the range of 1 to 100 nm (nanometers).

This has the particular advantage that a flat hysteresis can be achieved, in particular with nanocrystalline material, that is to say the permeability is relatively constant over a relatively large field strength range; this is better for an accurate measurement of the current. In addition, a flat hysteresis has low iron losses and less heating. A flat hysteresis is determined, in particular, by a ratio of remanence to saturation induction Br/Bs<0.3.

In one advantageous configuration of at least one embodiment of the invention, the circuit has a rectifier circuit, a measurement circuit and a transceiver.

This has the particular advantage that there is a simple implementation for the current sensor.

In one advantageous configuration of at least one embodiment of the invention, the secondary winding is connected to a rectifier circuit, the first output of which is connected, on the one hand, via a first diode, to a voltage stabilization circuit for an electronic unit having a controller, and, on the other hand, to a first series circuit comprising a first switching component and a first resistor, in particular wherein the first switching component is a field effect transistor, in particular a normally off type or enhancement type.

This has the particular advantage that there is a more specific simple configuration of a current sensor.

In one advantageous configuration of at least one embodiment of the invention, the circuit is configured in such a manner that, when a first voltage value is reached at the first input of the voltage stabilization circuit connected to the first diode, the first switching component is switched to be conductive, with the result that the secondary current of the current transformer flows via the first resistor, as a result of which an electrical voltage is dropped across the first resistor, from which the electrical current of the conductor can be determined, when a second voltage value is undershot at the first input of the voltage stabilization circuit connected to the first diode, the first switching component is switched to a current-blocking state, with the result that the secondary current of the transformer flows via the first diode and the voltage stabilization circuit.

This has the particular advantage that there is an implementation of the circuit for a current sensor.

In one advantageous configuration of at least one embodiment of the invention, the first resistor is connected to a first measurement circuit which, in the conductive phases of the first switching component, determines the level of the electrical current of the conductor from the secondary current of the current transformer flowing via the first resistor.

This has the particular advantage that there is a further implementation of a current sensor.

In one advantageous configuration of at least one embodiment of the invention, the first measurement circuit is connected to a transmitter or transceiver, via which the level of the electrical current can be communicated.

This has the particular advantage that there is a further configuration of a current sensor.

In one advantageous configuration of at least one embodiment of the invention, the controller is connected to the first measurement circuit which receives a signal when voltage values are reached or undershot.

In one advantageous configuration of at least one embodiment of the invention, the controller is connected to the transmitter or transceiver, wherein, when a third voltage value is reached at the first input of the voltage stabilization circuit connected to the first diode, the transmitter or transceiver is activated to emit a signal of the level of the current.

This has the particular advantage that targeted emission can be carried out.

At least one embodiment of the invention also specifies a parallel method for dimensioning the current transformer for a current sensor for determining the level of the current of a conductor of a low-voltage circuit, comprising:

a current transformer which has a magnetic core and is used both to measure the level of the current of the conductor and to supply energy to the current sensor, wherein the magnetic core is an annular core having a core inner diameter di, a middle diameter dFE and a core outer diameter da, wherein the annular core is wound with a secondary winding, as a result of which the core wound with the secondary winding has an inner opening with an inner diameter di_min and an outer circumference with an outer diameter da_max, wherein the conductor which forms the primary winding of the current transformer is guided through the inner opening, wherein the secondary winding is connected to a circuit, wherein the secondary winding supplies the circuit with electrical energy, and the circuit determines the level of the current of the conductor from the supplied electrical energy, digitizes it and wirelessly provides it.

According to at least one embodiment of the invention, the wound annular core is dimensioned, in particular wound, in such a manner that the difference between the middle diameter dFE as the minuend and the inner diameter di_min as the subtrahend is 0.5 to 0.6 times smaller than the difference between the outer diameter da_max as the minuend and the inner diameter di_min as the subtrahend in order to achieve an optimum for supplying energy and determining the level of the current in connection with the circuit.

All configurations, both in dependent form referring back to the independent patent claims, and referring back only to individual features or combinations of features of patent claims, improve a current sensor.

Figure 1:
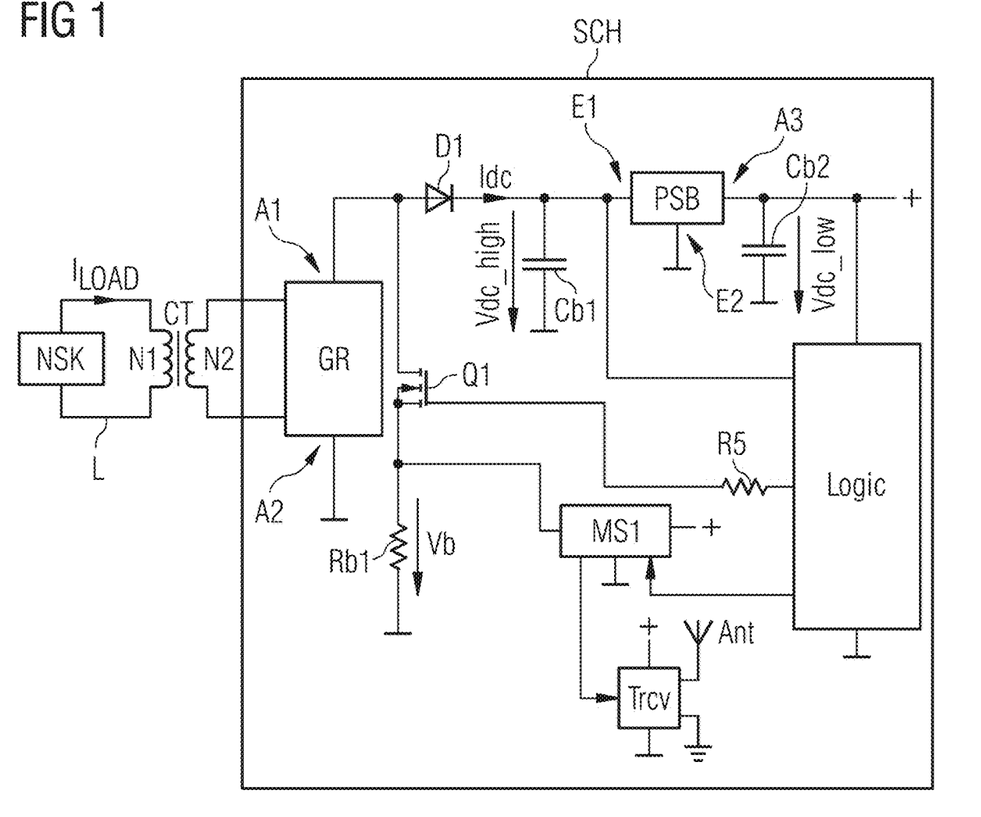
FIG. 1 shows a first illustration of an arrangement for explaining an embodiment of the invention.

FIG. 1 shows an illustration of an arrangement according to an embodiment of the invention having a low-voltage circuit NSK which has a conductor L having a current ILoad, the level of which is intended to be determined. The conductor L forms the primary side N1 of a current transformer CT, preferably having a core, the secondary side N2 of which, usually having a plurality of turns, is connected to a circuit SCH.

The circuit SCH is configured in such a manner that the circuit SCH determines the level of the current of the conductor L from the supplied electrical energy of the current transformer, digitizes and wirelessly provides the determined level of the current.

The circuit SCH can be implemented, for example, in such a manner that the secondary side N2 is connected to a rectifier circuit GR. The rectifier circuit may contain a bridge or Graetz rectifier circuit. A second output A2 of the rectifier circuit GR is connected to a common potential or ground potential, as depicted. For example, the second output A2 may have the negative potential of the rectified secondary voltage.

A first output A1, which has the positive potential in this example, is connected, on the one hand, to the first connection of a first diode D1 which is forward-biased; in the example, the anode of the first diode is connected to the first output A1. On the other hand, the second connection (cathode in the example) of the first diode D1 is connected to a first capacitor Cb1 which is connected, on the other hand, to the common potential or ground potential. Furthermore, the second connection of the first diode D1 is connected to the first input E1 of a voltage stabilization circuit PSB for generating a supply voltage, for example for an electronic unit EB having a controller Logic or only for the controller Logic (the electronic unit EB contains only the controller Logic, for example). The output A3 of the voltage stabilization circuit PSB is connected to the electronic unit EB/controller Logic for this purpose.

The second input E2 of the voltage stabilization circuit PSB is connected to the common potential/ground potential and at the same time forms the output of the voltage stabilization circuit PSB.

A second capacitor Cb2 for further stabilization or/and smoothing of the output voltage can be provided at the output A3 of the voltage stabilization circuit PSB. This capacitor is in turn connected to the common potential/ground potential. A second voltage Vdc_low is present across the second capacitor Cb2 and at the output of the voltage stabilization circuit PSB. This voltage may be 5 volts, 3.3 volts or 1.8 volts, for example.

In the example according to FIG. 1, a first measurement circuit MS1 is also connected to the output A3 of the voltage stabilization circuit PSB, which is indicated by two plus symbols. As a result, the first measurement circuit MS1 is supplied with energy.

The first output A1 of the rectifier circuit is connected, on the other hand, to a series circuit comprising a first switching component Q1 and a first resistor Rb1. The series circuit is connected, on the other hand, to the common potential/ground potential.

The first switching component Q1 may be a transistor, a field effect transistor, a semiconductor switch or the like. In particular, a field effect transistor of the enhancement type/normally off type is advantageous.

If the first switching component Q1 is switched on, a current flows through the first resistor Rb1. A voltage Vb which is dependent on the level of the resistance and naturally of the current is consequently dropped across said resistor.

In the example according to FIG. 1, the first measurement circuit MS1 is connected to the first resistor Rb1 at the connection point between the first switching component Q1 and the first resistor Rb1. The second connection to the first measurement circuit MS1 is established by the common potential/ground potential.

The controller Logic is connected, on the one hand, to the first input E1 of the voltage stabilization circuit PSB, to which the second connection of the first diode D1 and the first capacitor Cb1 are connected. Downstream of the first diode D1, a current Idc flows to the first capacitor Cb1 and to the voltage stabilization circuit PSB. A first voltage Vdc_high is present across the first capacitor Cb1.

This first voltage Vdc_high is monitored in the controller Logic for the reaching or exceeding of a first voltage value Vdc_high_max and also for the subsequent undershooting of a second voltage value Vdc_high_min. For example, the controller Logic has at least one comparator for this purpose.

The controller Logic is connected, on the other hand, to the first switching component Q1, for example to the gate connection of a field effect transistor, for example via a fifth resistor R5.

The controller Logic can also be connected to the first measurement circuit MS1 by virtue of the signal for the first switching component Q1, for example, being transmitted to the first measurement circuit MS1 in a parallel manner, with a slight time delay or in abbreviated form in order to synchronize the measurement operation with the switching operation.

The first measurement circuit MS1 determines the level of the electrical current of the conductor L1 from the level of the voltage drop Vb across the first resistor Rb1. This value can be provided by the measurement circuit MS1, for example can be transmitted to further applications or units such as miniature circuit breakers, circuit breakers, (current) monitoring devices, etc.

The first measurement circuit MS1 can digitize the level of the determined current.

A transmitter or transceiver Trcv can be connected to the first measurement circuit MS1. It can digitize the determined level of the current or can communicate the digitized level, for example to a further unit or control center.

The transmitter/transceiver Trcv can be supplied with energy by the voltage stabilization circuit PSB, which is indicated by a further plus symbol. The transmitter or transceiver Trcv has an antenna Ant.

Figure 2:
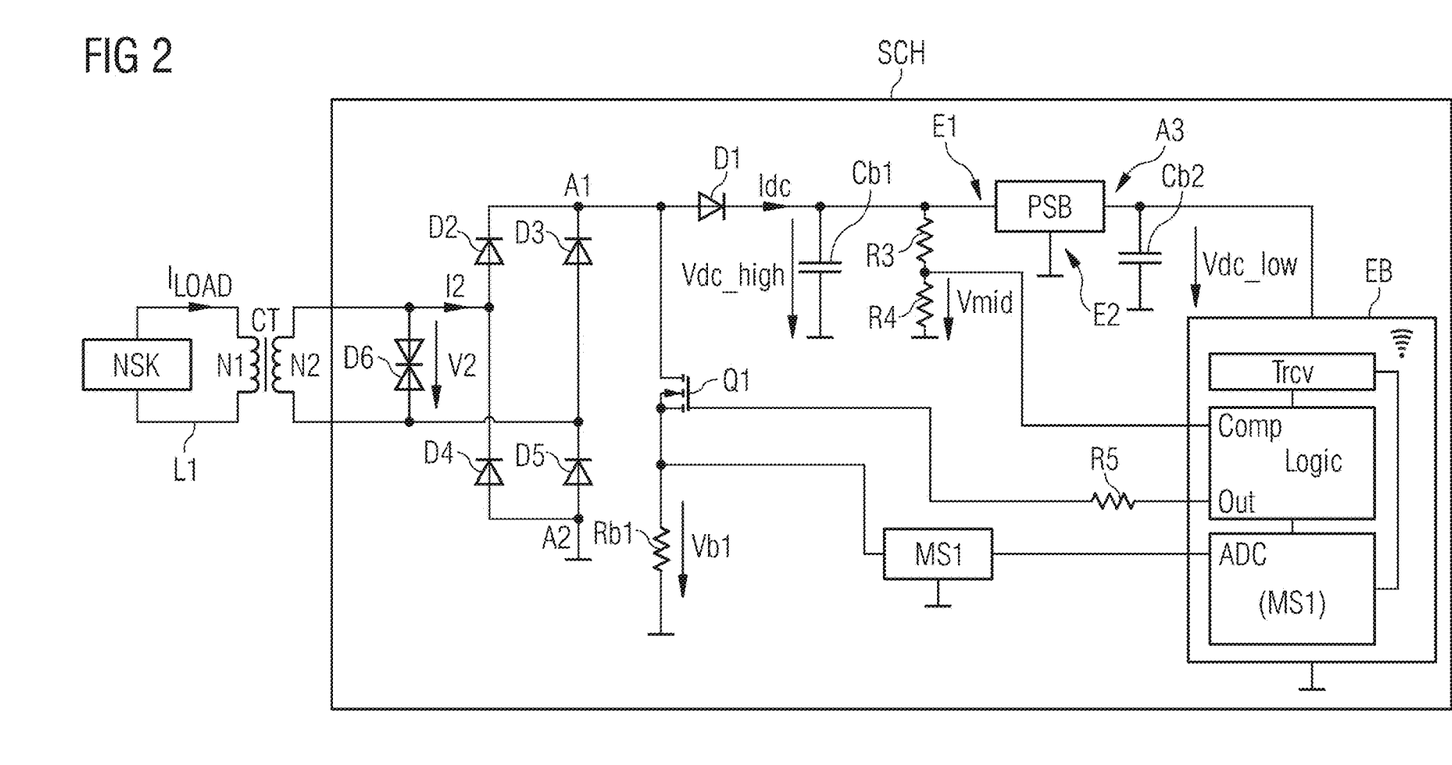
FIG. 2 shows a second illustration of an arrangement for explaining an embodiment of the invention.

FIG. 2 shows an arrangement according to FIG. 1, with the difference that the rectifier circuit GR is implemented as a bridge rectifier circuit with a second, third, fourth and fifth diode D2, D3, D4, D5. On the secondary side, a secondary current I2 with a secondary voltage V2 is supplied to this circuit.

Furthermore, a voltage-limiting component D6 is connected in parallel with the secondary winding N2 of the current transformer CT or transformer CT, that is to say between the two connections of the secondary side. This may be, for example, a suppressor diode, a varistor or the anti-parallel connection of one or more diodes (connected in series).

Furthermore, the connection between the controller Logic and the first input E1 of the voltage stabilization circuit PSB connected to the first diode D1 has a voltage divider formed by a third and a fourth resistor R3, R4 in the example. As a result, the first voltage Vdc_high is supplied, in reduced form as a divider voltage Vmid, to the controller Logic, for example to a comparator Comp of the controller Logic.

The controller Logic is also part of the electronic unit EB which also has the transceiver Trcv and a part ADC of the first measurement circuit MS1.

In the example according to FIG. 2, the first measurement circuit MS1 is divided, for example, by virtue of a part of the measurement circuit, for example an analog/digital converter ADC for digitization, being part of the electronic unit EB. That part of the measurement circuit MS1 which does not belong to the electronic block may contain signal conditioning, amplifiers or/and filters, for example.

The controller Logic can be connected to the first switching component Q1 via an output Out.

Implementing an (intelligent) current sensor which is able to accurately measure a current and to wirelessly transmit the data without an external power supply is a great challenge. Energy production using a current transformer produces heat which increases with time and the primary current. It must be ensured that the components are not damaged during operation at the maximum possible current.

Capturing a high current requires the permeability of the magnetic core to not fall excessively at the maximum current. It must be ensured that the saturation of the core does not take place in the measurement range. One solution is generally the use of a magnetic core with a large cross section and low permeability.

On the other hand, energy production even with a low primary current requires a current transformer which is able to transform a minimum power. One solution is to use a magnetic core with a large cross section and a high permeability.

These different requirements are dependent on one another and a measure for improving one parameter (core, size, permeability . . . ) can impair another parameter. The difficulty lies in finding a good or the best solution for meeting the requirements.

The electronic unit EB can also be a module with an integrated microcontroller (MU—microcontroller unit) and a transceiver Trcv.

Figures 3A, 3B:
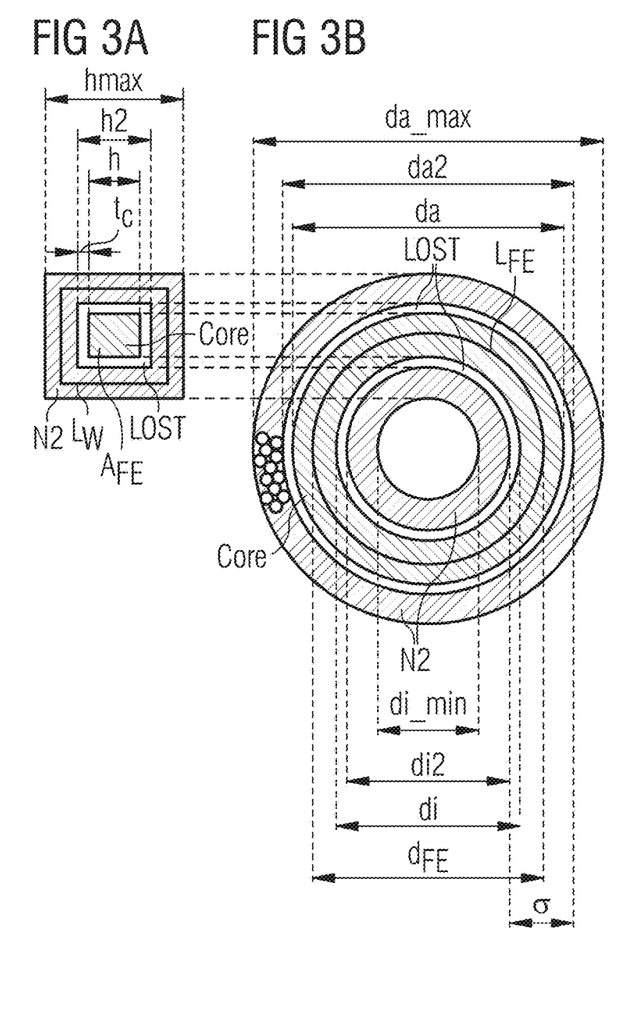
FIGS. 3A-D show an illustration of a current transformer for explaining an embodiment of the invention.
Figure 3C:
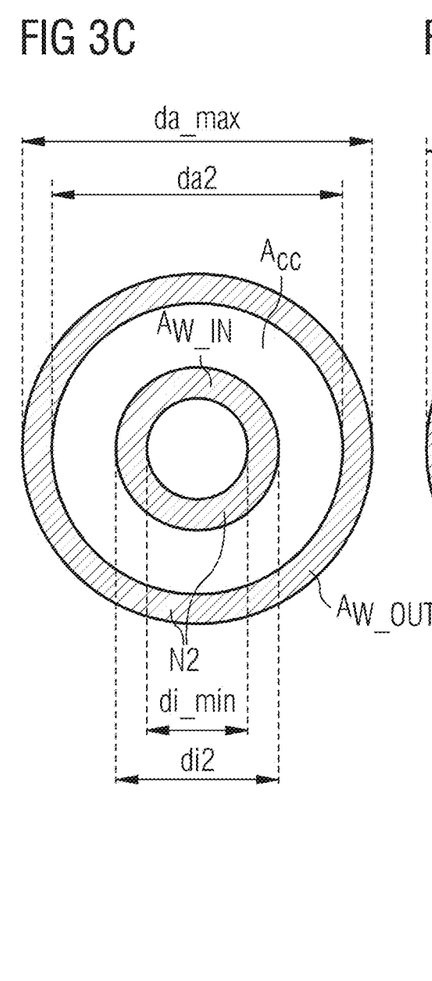
Figure 3D:
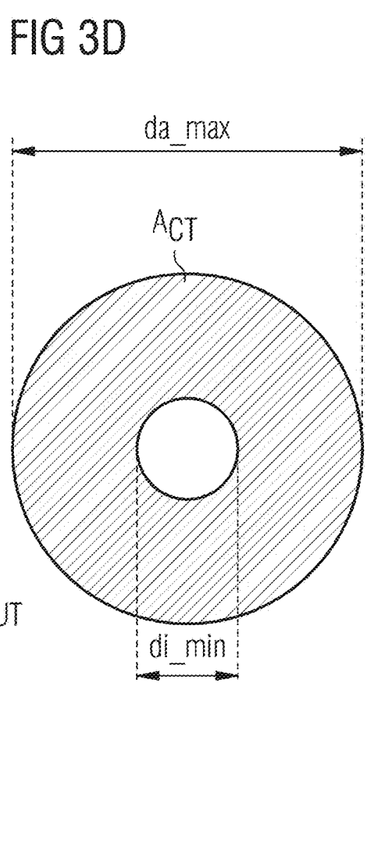

FIG. 3 shows four different sub-figures FIG. 3a, 3b, 3c, 3d of a core Core and its winding areas for a current transformer CT according to an embodiment of the invention.

FIG. 3b shows an annular core Core, for example an annular (circular) strip-wound core with a rectangular cross section having a core inner diameter di, a middle diameter dFE and a core outer diameter da.

The cross section of the annular core with a rectangular cross section according to FIG. 3b is shown in FIG. 3a. It has a width h. If a sheath (sheathing) of the core Core is provided, the width of the sheathed core is h2. If the core Core is wound with a secondary winding N2, the width of the wound core is hmax. The sheath width tc and an average wire length LW of a turn of the secondary winding N2 are likewise depicted in FIG. 3a.

The annular core Core according to FIG. 3b is wound with a secondary winding N2 which is indicated by rings.

According to FIG. 3c, the secondary winding N2 has an inner area AW_IN inside the annular core Core and an outer area AW_OUT outside the annular core Core.

The inner area AW_IN is determined by the sheath inner diameter di2 (inner diameter of the sheathed core di2) and the inner diameter di_min of the wound core.

The outer area AW_OUT is determined by the sheath outer diameter da2 (outer diameter of the sheathed core da2) and the outer diameter da_max of the wound core.

The sheath inner diameter di2 may correspond (or at least approximately) to the core inner diameter di if no sheath of the core Core is provided. Otherwise, the inner diameter of the sheathed core di2 is less than the core inner diameter di, either by virtue of a sheath or possibly a planned waste space LOST.

The sheath outer diameter da2 may correspond (or at least approximately) to the core outer diameter da if no sheath of the core Core is provided. Otherwise, the outer diameter of the sheathed core da2 is greater than the core outer diameter da, either by virtue of a sheath or possibly a planned waste space LOST.

According to FIG. 3c, the core, in particular with a sheath or sheathing, has a core area Acc. This is determined by the sheath outer diameter da2 and the sheath inner diameter di2.

According to FIG. 3d, the wound current transformer has a current transformer area Act. This is determined by the outer diameter da_max and the inner diameter di_min. The area usually results from:

$$Act = Pi/4(da\_max^2 - di\_min^2).$$

As a result, the annular core Core with the secondary winding N2 has an inner opening with the inner diameter di_min and an outer circumference with the outer diameter da_max. A conductor L which forms the primary side or primary winding N1, the level of the current of which is intended to or can be determined, can, is or has been guided through the inner opening.

The annular core Core preferably has a relative permeability between 10,000 and 100,000, in particular between 30,000 and 50,000, more specifically a value of approximately 40,000.

The annular core is preferably made of a ferromagnetic or soft-magnetic material, in particular nanocrystalline material, in particular with flat hysteresis.

Referring to FIGS. 1, 2 and 3, the minimum starting current of the current transformer is given by:

$$I_{start} = \frac{L_{FE}}{A_{FE} \cdot \mu \cdot \omega \cdot N_2} \cdot \left( \frac{V_{DC}}{\eta \cdot (1 - DC_{sense\_MIN})} + V_F \right) + I_{DC} \cdot N_2$$

The left-term represents the current which is needed to obtain a sufficient voltage, and the right-hand term represents the additional current for supplying the circuit with the current Idc or $I_{DC}$ or IDC. The number of turns N2 has opposite effects on both sides and it is not simple to determine an optimum value. It can be assumed that the best value N2_OPT results in a minimum value of the starting current Istart and a zero condition:

$$\frac{dI_{start}(N_{2\_OPT})}{dN_2} = 0$$

The following is obtained:

$$N_{2\_OPT} = \sqrt{\frac{L_{FE}}{A_{FE} \cdot \mu \cdot \omega \cdot I_{DC}} \cdot \left( \frac{V_{DC}}{\eta \cdot (1 - DC_{sense\_MIN})} + V_F \right)}$$

If the optimum number of turns is used, the value of the starting current is optimized and the equation becomes independent of the number of secondary windings N2:

$$I_{START\_OPT} =$$
$$I_{START}(N_{2\_OPT}) = 2 \cdot \sqrt{\frac{I_{DC} \cdot L_{FE}}{A_{FE} \cdot \mu \cdot \omega} \cdot \left( \frac{V_{DC}}{\eta \cdot (1 - DC_{sense\_MIN})} + V_F \right)}$$

This equation can be transformed in order to obtain the influence of the core dimensions $$\frac{\sigma}{d_{FE}} = \Psi = \frac{4\pi \cdot I_{DC}}{\eta_{CC} \cdot \eta_{FE} \cdot h_2 \cdot \omega \cdot \mu \cdot I_{START}^2} \cdot \left( \frac{V_{DC}}{\eta \cdot (1 - DC_{sense\_MIN})} + V_F \right)$$

The available space for the current transformer CT is used efficiently if the available surfaces for copper are the same inside and outside the sheathed core:

$$A_{W\_IN} = \frac{\pi}{4}(d_{i2}^2 - d_{i\_min}^2) = A_{W\_OUT} = \frac{\pi}{4}(d_{a\_max}^2 - d_{a2}^2) = \frac{d_{a2} - d_{i2}}{2}$$

This equation results in the following new geometrical relationship:

$$d_{FE} = \sqrt{\frac{d_{a\_max}^2 + d_{i\_min}^2}{2} - \sigma^2}$$

It should be ensured that the power loss does not exceed a value which would damage the circuit or electronics or other components. The total power loss at the current transformer CT and the connected circuit is as follows:

$$P_{DIS} = \frac{R_W \cdot I_F^2}{N_2^2} + \frac{R_B \cdot I_F^2}{N_2^2} + V_F \cdot \frac{I_F}{N_2} + \text{Core losses}$$

Only the power loss at the current transformer CT can be optimized via the current transformer design:

$$P_W = \frac{\gamma \cdot L_W \cdot I_F^2}{A_W^{2/n}} \cdot N_2^{\frac{2-n}{n}} < P_{W\_MAX}$$

with $$P_{W\_MAX} = P_{MAX} - \left( \frac{R_B \cdot I_F^2}{N_2^2} + V_F \cdot \frac{I_F}{N_2} + \text{Core losses} \right)$$

$$\gamma = \frac{\alpha \cdot (1 + f_u)^{2/n} \cdot (1 + TC_{Cu} \cdot (T_f - 20^\circ \text{ C.}))}{\beta^{2/n}}$$

if the following values of LW and AW are assumed:

$$L_W = d_{a\_max} - d_{i\_max} + 2 \cdot h_2$$

$$A_W = A_{W\_IN} = A_{W\_OUT} = \frac{\pi}{8} \cdot (d_{a\_max}^2 - d_{i\_min}^2 - 4 \cdot d_{FE} \cdot \sigma)$$

In order to ensure that the maximum power loss at the current transformer is not exceeded, the maximum value of σ is:

$$\sigma_{max} = \frac{d_{a\_max} - d_{i\_min}}{2} - \frac{4 \cdot (\gamma \cdot L_W)^{\pi/2} \cdot I_F^n \cdot N_2^{\frac{2-n}{n}}}{\pi \cdot (d_{a\_max} + d_{i\_min}) \cdot P_{W\_MAX}^{n/2}}$$

The area occupied by the sheathed core is as follows:

$$A_{CC} = \pi \cdot d_{FE} \cdot \sigma$$

On the basis of the above-mentioned knowledge and equations, it appears that the best core diameter and the best core width for most current transformers for current sensors should advantageously have the following relationship:

$$0.5 \leq \frac{d_{FE} - d_{i\_min}}{d_{a\_max} - d_{i\_min}} \leq 0.6$$

$$0.65 \leq \frac{A_{CC}}{A_{CT}} \leq 0.9$$

or $$0.5 \leq (d_{FE} - d_{i\_mi})/(d_{a\_max} - d_{i\_min}) \leq 0.6$$

$$0.65 \leq A_{CC}/A_{CT} \leq 0.9$$

where the following apply:
Acc: core area of the sheathed core
Act: current transformer area
AFE: cross-sectional area of the core
AW: area for secondary winding (copper winding)
AW_IN: inner area of the secondary winding (inner region for secondary winding)
AW_OUT: outer area of the secondary winding (outer region for secondary winding)
DCsense_MIN: factor representing the ratio of the measurement time to the total time since some time is needed for energy harvesting. The factor is less than 100%. The factor is usually small in the case of a low current and increases with the current. The starting current is defined by the current at which DCsense>=Dcsense_min. DCsense_min may be 50%, for example, that is to say the measurement time is 50% of the total time for the starting current (remaining time for supplying energy via "energy harvesting").
da: core outer diameter, outer diameter of the core
da2: outer diameter of the sheathed core
da_max: outer diameter of the wound core
dF: middle (core) diameter
dFE=LFE/π=(da2+di2)/2
di: core inner diameter, inner diameter of the core
di2: inner diameter of the sheathed core
di_min: inner diameter of the wound core, minimum inner diameter
fu: deviation from the ideal filling factor of a wire winding as a result of practical manufacture, generally 30%
h: width of the core
h2: width of the sheathed core
Idc or IDC: consumption current of the electronics
IF: maximum current
MART: starting current for energy production
LFE: middle circumference of the core
LW: average wire length of a turn of the secondary winding
n: constant for the filling factor of the copper wire. n=1.883
N2: number of turns of the secondary winding/secondary winding (number)
N2_OPT: optimum number of turns
PDIS: complete power loss
PMAX: maximum permissible power loss at the sensor
PW: power loss in the secondary winding
PW_MAX: maximum permissible power loss in the current transformer
Rb1 or RB: load resistance for the measurement
RW: resistance of the wire of the secondary winding N2
tc: width of the sheath or distance between the core and the secondary winding. da2=da+2·tc
TCCu: temperature coefficient of the resistivity of copper
Tf: maximum permissible temperature in the current transformer
VdcorVDC: supply voltage of the electronics
VF: summed forward voltages of the rectifier diodes
β: constant for the filling factor of 1 mm² of copper wire. β=1.0223 wire/mm$^{m-2}$
α: resistance per unit length of 1 mm² of copper wire. α=2.18 10−5 Ω·mm
$\eta_{FE}$: filling factor for the core, in particular the strip-wound core (there is some air between each strip)—generally approximately 80% or 0.8.
$\eta_{CC}$: filling factor of the sheathed core
μ: permeability of the core (for a low field strength)
ω: angular frequency
η: efficiency of the power supply block
σ: radial width of the sheathed core
σ=dFE−di2=da2−dFE The invention proposes an optimized design for a current transformer with an annular core, in particular a strip-wound core, and with a rectangular cross section, in particular.

The best possible performance of a current sensor when producing energy in the tightest space and under non-optimum conditions with respect to temperature and heat dissipation is achieved with this current sensor. Any choice of the dimensions outside the proposed ranges results in a poorer performance. Either the starting current is higher or the maximum permissible nominal current is lower.

For example, the current transformer can be used in a current sensor which is in turn integrated, for example, in a fuse or another device, in particular with little installation space.

Embodiments of the invention can be used to advantageously implement a precise wireless device with its own power supply for determining the level of the current of a conductor, for example as a communication sensor, in particular with a starting current which is as low as possible for the measurement function. The invention is suitable, in particular, for rated currents of 63 amperes, 125 amperes, 250 amperes and 400 amperes.

A very small and compact structure can be achieved by using the current transformer according to the invention with an electronic unit, for example with a microprocessor.

Although the invention has been described and illustrated more specifically in detail by way of the example embodiment, the invention is not restricted by the disclosed examples and other variations can be derived therefrom by a person skilled in the art without departing from the scope of protection of the invention.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A current sensor for determining the level of the current of a conductor of a low-voltage circuit, comprising:
    a current transformer, including a magnetic core, to measure the level of the current of the conductor and to supply energy to the current sensor, the magnetic core being an annular core including a core inner diameter, a middle diameter and a core outer diameter,
    wherein the annular core is wound with a secondary winding to form a wound inner core, including an inner opening with an inner diameter and an outer circumference with an outer diameter,
    wherein the conductor, forming a primary winding of the current transformer, is guided through the inner opening,
    wherein a secondary winding of the current transformer, connected to a circuit, to supply the circuit with electrical energy, the circuit being configured to determine the level of the current of the conductor from the electrical energy supplied, to digitize the current, and to wirelessly provide the current,
    the wound annular core being configured such that a difference between a middle diameter as a minuend and the inner diameter as the subtrahend is 0.5 to 0.6 times smaller than a difference between the outer diameter as the minuend and the inner diameter as the subtrahend, to achieve an optimum for supplying energy and determining the level of the current in connection with the circuit.

2. The current sensor of claim 1, wherein the annular core includes a sheath.

3. The current sensor of claim 2,
    wherein the annular core including the sheath includes a sheath outer diameter and a sheath inner diameter, the sheathed core including a core area formed by a difference of squares of the sheath outer diameter and the sheath inner diameter multiplied by Pi/4;
    wherein the core wound with the secondary winding has a current transformer area formed by a difference of squares of the outer diameter and the inner diameter multiplied by Pi/4; and
    wherein the core area is 0.65 to 0.9 times the current transformer area to achieve an optimum for supplying energy and determining the level of the current in connection with the circuit.

4. The current sensor of claim 1, wherein the annular core is an annular strip-wound core.

5. The current sensor of claim 1, wherein the annular core includes a rectangular cross section.

6. The current sensor of claim 1, wherein the annular core includes a relative permeability between 10,000 and 100,000.

7. The current sensor of claim 1, wherein the annular core is made of a ferromagnetic material.

8. The current sensor of claim 1, wherein the circuit includes a rectifier circuit, a measurement circuit and a transceiver.

9. The current sensor of claim 1, wherein the secondary winding is connected to a rectifier circuit, a first output of the rectifier circuit being connected, via a first diode, to a voltage stabilization circuit for an electronic unit including a controller and the rectifier circuit being further connected to a first series circuit including a first switching component and a first resistor.

10. The current sensor of claim 9, wherein the circuit is configured such that,
    when a first voltage value is reached at the first input of the voltage stabilization circuit connected to the first diode, the first switching component is switched to be conductive, resulting in the secondary current of the current transformer flowing via the first resistor, and further resulting in an electrical voltage being dropped across the first resistor, from which the electrical current of the conductor is determinable, and
    when a second voltage value is undershot at the first input of the voltage stabilization circuit connected to the first diode, the first switching component is switched to a current-blocking state, resulting in the secondary current of the current transformer flowing via the first diode and the voltage stabilization circuit.

11. The current sensor of claim 10, wherein the first resistor is connected to a first measurement circuit to, in conductive phases of the first switching component, determine the level of the electrical current of the conductor from the secondary current of the current transformer flowing via the first resistor.

12. The current sensor of claim 11, wherein the first measurement circuit is connected to a transmitter or transceiver, to communicate the level of the electrical current.

13. The current sensor of claim 12, wherein the controller is connected to the first measurement circuit, configured to receive a signal when voltage values are reached or undershot.

14. The current sensor of claim 13, wherein the controller is connected to the transmitter or transceiver, wherein when a third voltage value is reached at the first input of the voltage stabilization circuit connected to the first diode, the transmitter or transceiver is activated to emit a signal of the level of the current.

15. A method for dimensioning a current transformer for a current sensor for determining the level of the current of a conductor of a low-voltage circuit, the method comprising:

dimensioning the current transformer to include a magnetic core, configured to measure the level of the current of the conductor and to supply energy to the current sensor, the magnetic core being an annular core including a core inner diameter, a middle diameter and a core outer diameter and the annular core being wound with a secondary winding, the core wound with the secondary winding including an inner opening with an inner diameter and an outer circumference with an outer diameter, the conductor forming the primary winding of the current transformer being guided through the inner opening and the secondary winding being connected to a circuit to supply the circuit with electrical energy, the circuit being configured to determine the level of the current of the conductor from the supplied electrical energy, digitize the current and wirelessly provide the current, wherein the wound annular core is dimensioned such that a difference between the middle diameter as a minuend and the inner diameter as a subtrahend is 0.5 to 0.6 times smaller than a difference between the outer diameter as the minuend and the inner diameter as the subtrahend to achieve an optimum for supplying energy and determining the level of the current in connection with the circuit.

16. The current sensor of claim 2, wherein the annular core includes a sheath, made of insulating material.

17. The current sensor of claim 16, wherein the annular core including the sheath includes a sheath outer diameter and a sheath inner diameter, the sheathed core including a core area formed by a difference of squares of the sheath outer diameter and the sheath inner diameter multiplied by Pi/4;

wherein the core wound with the secondary winding has a current transformer area formed by a difference of squares of the outer diameter and the inner diameter multiplied by Pi/4; and wherein the core area is 0.65 to 0.9 times the current transformer area to achieve an optimum for supplying energy and determining the level of the current in connection with the circuit.

18. The current sensor of claim 6, wherein the annular core includes a relative permeability between 30,000 and 50,000.

19. The current sensor of claim 1, wherein the annular core is made of a nanocrystalline material.

20. The current sensor of claim 9, wherein the first switching component is a field effect transistor.

* * * * *